(12) United States Patent
Sonoda et al.

(10) Patent No.: US 9,843,013 B2
(45) Date of Patent: Dec. 12, 2017

(54) ELECTROLUMINESCENT DEVICE AND METHOD FOR MANUFACTURING SAME

(71) Applicant: Sharp Kabushiki Kaisha, Osaka-shi, Osaka (JP)

(72) Inventors: Tohru Sonoda, Osaka (JP); Takeshi Hirase, Osaka (JP); Tetsuya Okamoto, Osaka (JP); Tohru Senoo, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/914,722

(22) PCT Filed: Jul. 9, 2014

(86) PCT No.: PCT/JP2014/068305
§ 371 (c)(1),
(2) Date: Feb. 26, 2016

(87) PCT Pub. No.: WO2015/029608
PCT Pub. Date: Mar. 5, 2015

(65) Prior Publication Data
US 2016/0204374 A1 Jul. 14, 2016

(30) Foreign Application Priority Data

Aug. 28, 2013 (JP) .................................. 2013-176991

(51) Int. Cl.
*H01L 51/52* (2006.01)
*H01L 51/00* (2006.01)
*H01L 51/56* (2006.01)

(52) U.S. Cl.
CPC ........ *H01L 51/524* (2013.01); *H01L 51/0008* (2013.01); *H01L 51/5256* (2013.01); *H01L 51/56* (2013.01)

(58) Field of Classification Search
CPC ............... H01L 51/0008; H01L 51/524; H01L 51/5256; H01L 51/56
See application file for complete search history.

(56) References Cited

U.S. PATENT DOCUMENTS 7,629,740 B2 * 12/2009 Sano .................... H01L 51/5259
313/506
2004/0056589 A1 3/2004 Yamazaki et al.
(Continued)

FOREIGN PATENT DOCUMENTS

CN 102124574 A 7/2011
JP 2004-119016 A 4/2004
(Continued)

*Primary Examiner* — Allan R Wilson
(74) *Attorney, Agent, or Firm* — Keating & Bennett, LLP

(57) ABSTRACT

In an organic EL display device (electroluminescent device) including an organic EL element (electroluminescent element), a sealing film is provided to seal the organic EL element. The sealing film includes a first inorganic layer, a first organic layer, a second inorganic layer, a second organic layer, and a third inorganic layer (uppermost inorganic layer), which are arranged in this order. The first and second organic layers are formed so that the thickness of the end portions gradually decreases from the thickness of the central portions. The third inorganic layer is provided to cover the end portions of each of the first inorganic layer, the first organic layer, the second inorganic layer, and the second organic layer.

13 Claims, 14 Drawing Sheets

(56) References Cited

U.S. PATENT DOCUMENTS

| | | | |
|---|---|---|---|
| 2004/0232832 A1* | 11/2004 | Kubota | H01L 51/5256 313/512 |
| 2008/0238301 A1 | 10/2008 | Shim et al. | |
| 2008/0309226 A1 | 12/2008 | Kim et al. | |
| 2009/0278454 A1* | 11/2009 | Fedorovskaya | G02B 5/201 313/512 |
| 2010/0187986 A1 | 7/2010 | Kajitani et al. | |
| 2011/0052857 A1 | 3/2011 | Suzuki et al. | |
| 2011/0089401 A1 | 4/2011 | Hiraiwa et al. | |
| 2011/0140163 A1 | 6/2011 | Oh et al. | |
| 2012/0091477 A1* | 4/2012 | Kim | H01L 51/5246 257/88 |
| 2012/0319141 A1* | 12/2012 | Kim | H01L 51/525 257/88 |
| 2013/0229108 A1* | 9/2013 | Chen | H01L 51/5253 313/511 |
| 2015/0035431 A1* | 2/2015 | Lee | H01L 51/5253 313/504 |
| 2015/0236299 A1* | 8/2015 | Kang | H01L 27/3276 257/40 |

FOREIGN PATENT DOCUMENTS

| | | |
|---|---|---|
| JP | 2006-004650 A | 1/2006 |
| JP | 2008-311205 A | 12/2008 |
| JP | 2009-037812 A | 2/2009 |
| JP | 2011-124213 A | 6/2011 |
| JP | 2012-119338 A | 6/2012 |
| WO | 2009/104241 A1 | 8/2009 |
| WO | 2009/139292 A1 | 11/2009 |
| WO | 2013/111218 A1 | 8/2013 |

* cited by examiner

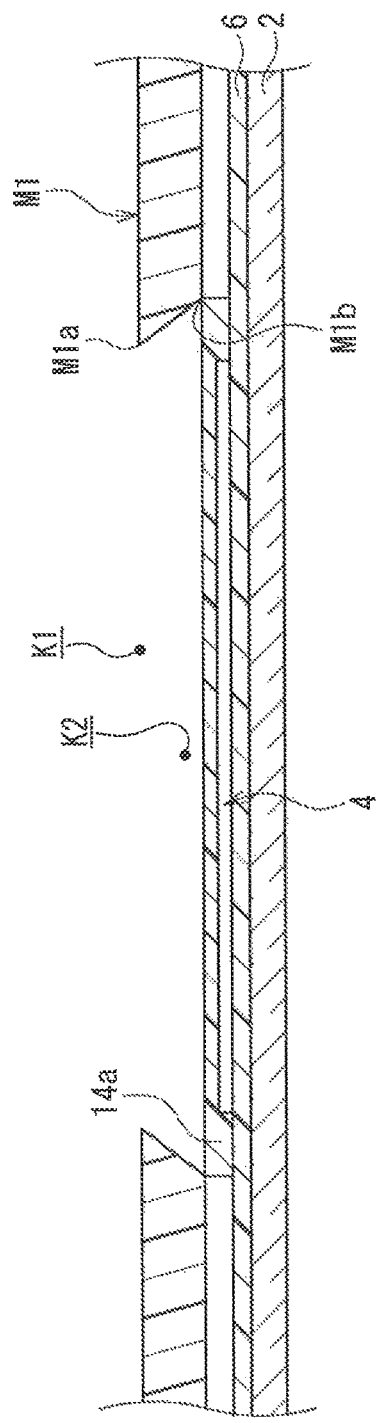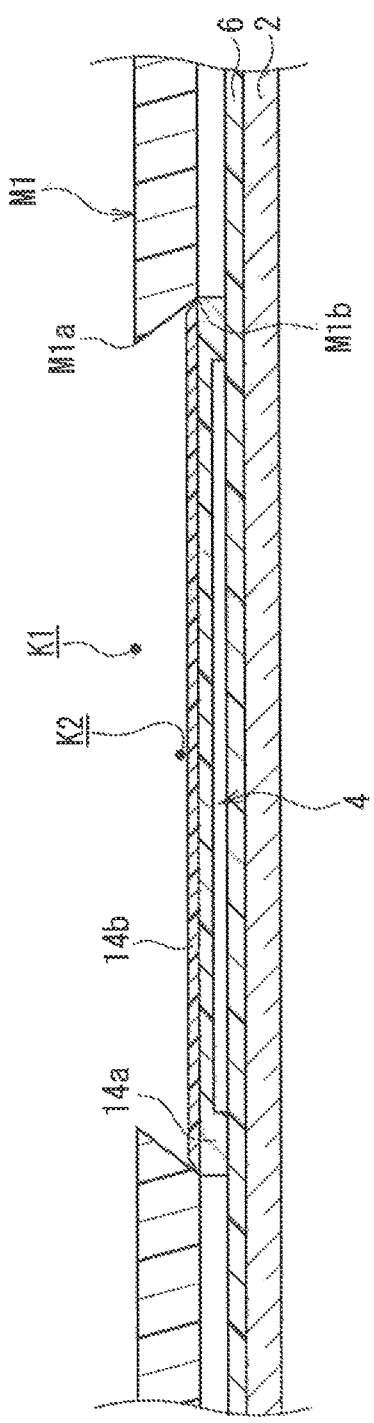

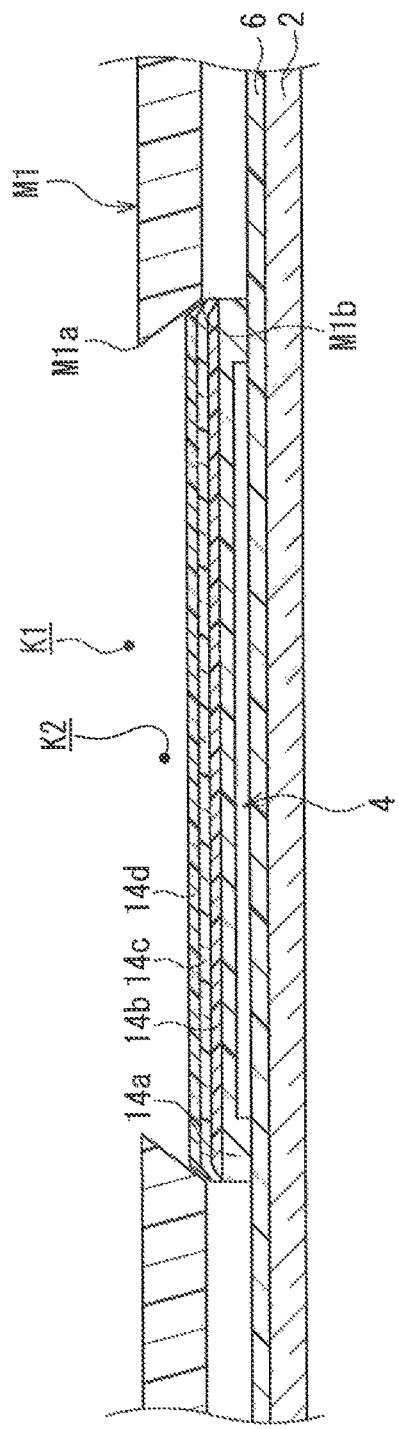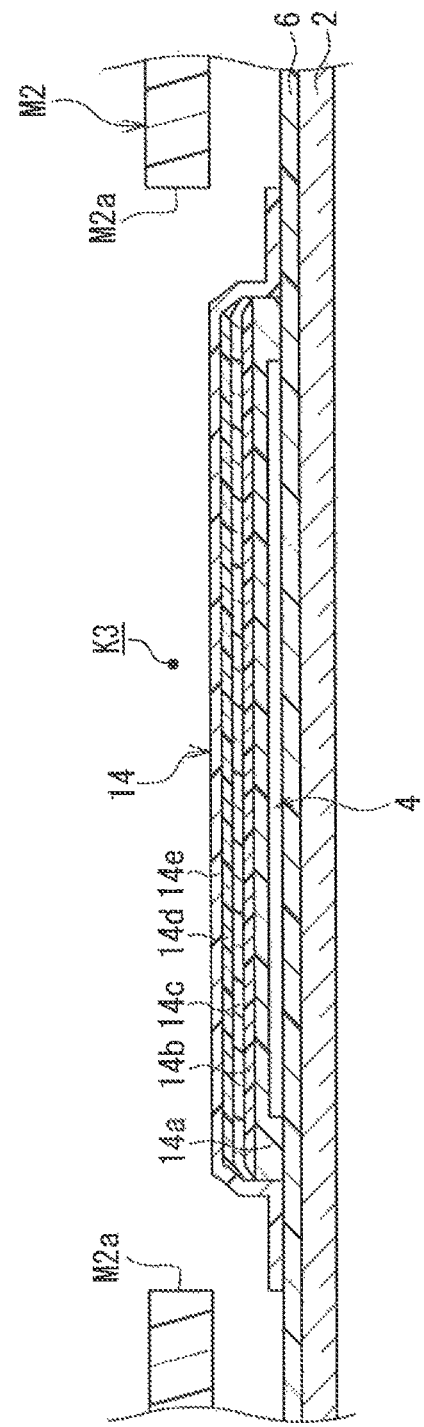
FIG. 7A
FIG. 7B

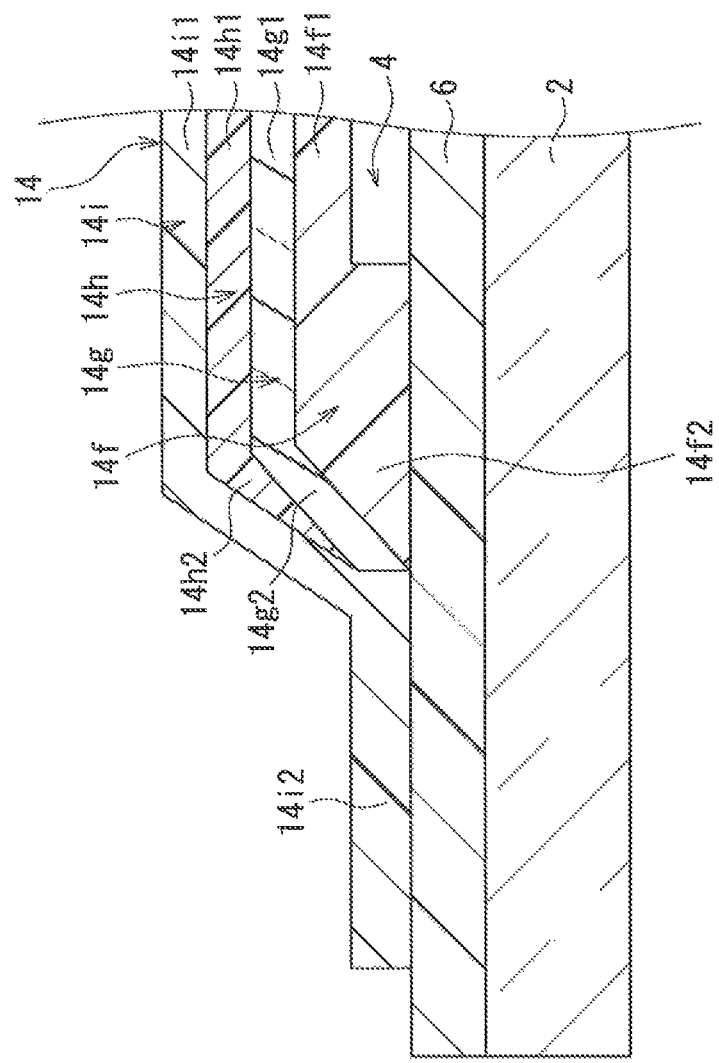
F I G. 10

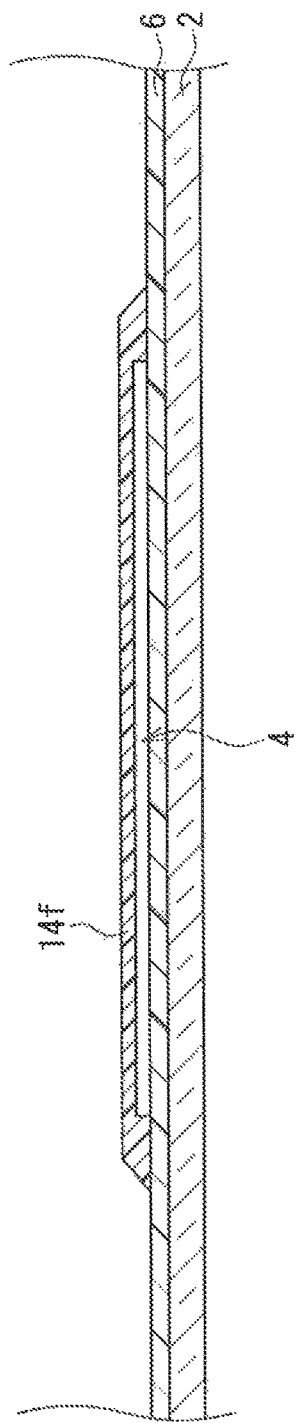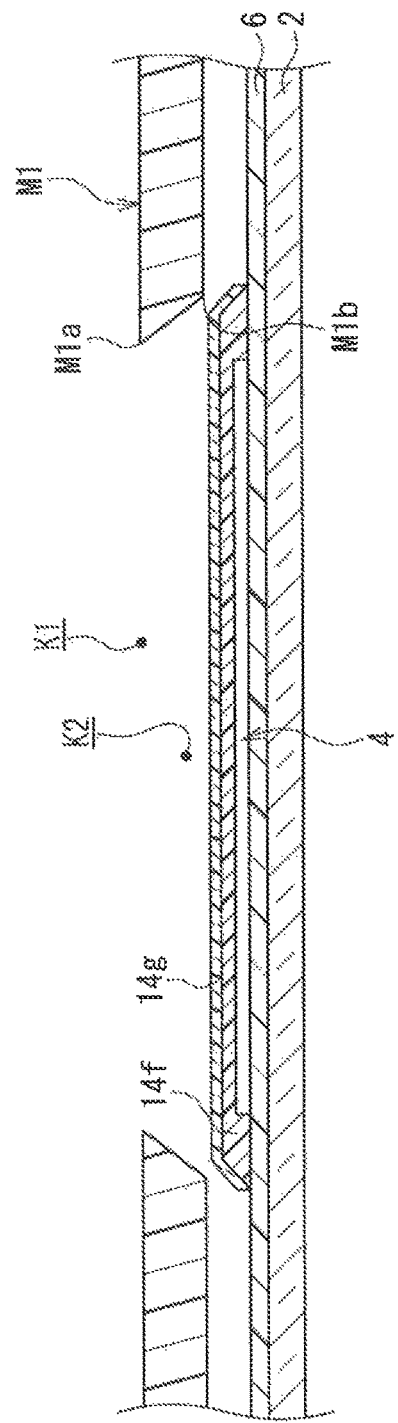

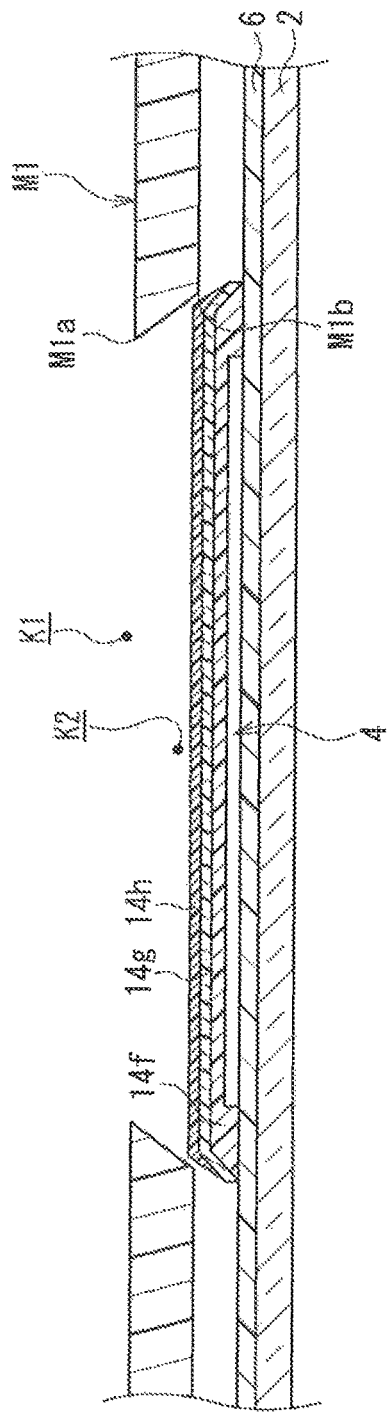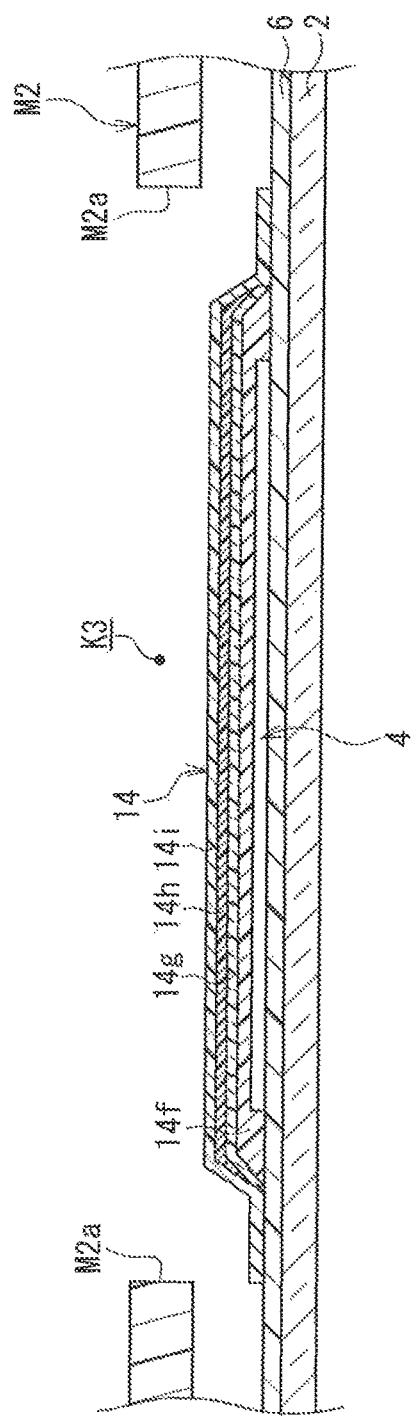

ELECTROLUMINESCENT DEVICE AND METHOD FOR MANUFACTURING SAME

TECHNICAL FIELD

The present invention relates an electroluminescent device including an EL (electroluminescent) element and a method for manufacturing the electroluminescent device.

BACKGROUND ART

In recent years, flat panel displays have been widely used in various commodities and fields, and the flat panel displays are required to have a larger size, a higher image quality, and a lower power consumption.

Under these circumstances, an organic EL display device is attracting considerable attention as an all-solid-state flat panel display with excellent low-voltage driving capability, high-speed responsibility, and self-luminous property. The organic EL display device includes an organic EL element that utilizes the electroluminescence of an organic material.

In an active matrix type organic EL display device, e.g., a thin-film organic EL element is provided on a substrate having TFTs (thin-film transistors). The organic EL element includes an organic EL layer (including a light emitting layer) that is disposed between a pair of electrodes. The TFTs are connected to one of the pair of electrodes. A voltage is applied across the pair of electrodes so that the light emitting layer emits light, thereby displaying images.

In the above conventional organic EL display device, it is known that a sealing film is formed on the organic EL element in order to prevent the degradation of the organic EL element due to moisture or oxygen. Moreover, a laminated film composed of an inorganic layer and an organic layer is used as the sealing film of the conventional organic EL display device.

Specifically, a conventional organic EL display device including an encapsulating film has been proposed, as described in, e.g., Patent Document 1. The encapsulating film is formed so that the density and thickness of the encapsulating film increase in a direction from a center portion to an edge portion of the organic EL display device. This conventional organic EL display device can prevent the permeation of moisture or oxygen through the sides of the device.

A conventional organic EL display device including a sealing film in which each of organic layers and each of inorganic layers are alternately stacked has been proposed, as described in, e.g., Patent Document 2. In the sealing film, each of the organic layers other than the uppermost organic layer is formed in a region that is smaller than the inorganic layer. Thus, except for the uppermost organic layer that adheres to a sealing glass substrate, the ends of each of the organic layers are covered with two stacked inorganic layers so as not to be exposed to the outside. This conventional organic EL display device can prevent the deterioration of the organic layers due to exposure.

PRIOR ART DOCUMENTS

Patent Documents

Patent Document 1: JP 2011-124213 A
Patent Document 2: JP 2009-37812 A

DISCLOSURE OF INVENTION

Problem to be Solved by the Invention

However, in the above conventional organic EL display devices (electroluminescent devices), since the permeation of moisture cannot be reliably suppressed, the degradation of the organic EL element cannot be prevented, which significantly reduces the reliability.

Specifically, in the conventional organic EL display device of Patent Document 1, the organic layer is exposed. Therefore, even if the density and thickness of the organic layer increase, the permeation of moisture or oxygen cannot be reliably suppressed. Moreover, the thickness of the inorganic layer gradually decreases toward the end of the inorganic layer. Therefore, if the inorganic layer has a defect such as pinholes, moisture or the like can easily permeate through the defect or the organic layer.

In the conventional organic EL display device of Patent Document 2, a plurality of inorganic layers are stacked in direct contact with each other. Therefore, the membrane stress is increased in the laminated portion, and this stress may cause the inorganic layers to peel off, or may remove the inorganic layer from the substrate. Consequently, moisture or the like permeates through the organic layers, so that the reliability of the organic EL display device is significantly reduced.

With the foregoing in mind, it is an object of the present invention to provide an electroluminescent device that reliably suppresses the permeation of moisture and has excellent reliability, and a method for manufacturing the electroluminescent device.

Means for Solving Problem

To achieve the above object, an electroluminescent device of the present invention includes a substrate and an electroluminescent element provided on the substrate. The electroluminescent device includes a sealing film that seals the electroluminescent element. The sealing film is composed of two or more organic layers and two or more inorganic layers. Each of the two or more organic layers and each of the two or more inorganic layers of the sealing film are alternately arranged. Each of the two or more organic layers is formed so that the thickness gradually decreases in the end portions. The uppermost layer of the sealing film is the inorganic layer, and the uppermost inorganic layer is provided to cover the end portions of the lower organic layers and the end portions of the lower inorganic layers.

In the electroluminescent device having the above configuration, the sealing film is composed of two or more organic layers and two or more inorganic layers, and each of the organic layers and each of the inorganic layers are alternately arranged. Each of the two or more organic layers is formed so that the thickness gradually decreases in the end portions. The uppermost layer of the sealing film is the inorganic layer, and the uppermost inorganic layer is provided to cover the end portions of the lower organic layers and the end portions of the lower inorganic layers. Thus, unlike the conventional examples, the electroluminescent device can reliably suppress the permeation of moisture and have excellent reliability.

In the electroluminescent device, it is preferable that each of the two or more inorganic layers is formed so that the thickness does not gradually decrease in the end portions.

This can easily improve the sealing performance of the sealing film with respect to the electroluminescent element.

In the electroluminescent device, it is preferable that a gradual decrease region in which the thickness of each of the two or more organic layers gradually decreases is provided in an outer region of the electroluminescent element on the substrate.

This can reliably prevent not only a reduction in the reliability of the sealing film, but also a reduction in the reliability of the electroluminescent device, and also can prevent a reduction in the performance of the electroluminescent device.

In the electroluminescent device, it is preferable that each of the two or more organic layers is formed so that the thickness is substantially uniform in a portion located on the electroluminescent element.

This can easily improve the sealing performance of the sealing film with respect to the electroluminescent element, and also can prevent a reduction in the performance of the electroluminescent device.

The electroluminescent device preferably includes a counter substrate that is located on the opposite side of the electroluminescent element with respect to the substrate, and a sealing material in the form of a frame that seals the electroluminescent element between the substrate and the counter substrate.

This configuration can more reliably prevent the degradation of the electroluminescent element.

A method for manufacturing an electroluminescent device of the present invention provides an electroluminescent device including a substrate and an electroluminescent element provided on the substrate. The manufacturing method includes the following: forming a first organic layer on the electroluminescent element or the lowermost inorganic layer that seals the electroluminescent element, the first organic layer having a thickness that gradually decreases in the end portions; forming an intermediate inorganic layer on the first organic layer; forming a second organic layer on the intermediate inorganic layer, the second organic layer having a thickness that gradually decreases in the end portions; and forming the uppermost inorganic layer to cover the end portions of each of the inorganic layers and the end portions of each of the first and second organic layers.

The manufacturing method of the electroluminescent device having the above configuration includes the process of forming the first organic layer on the electroluminescent element or the lowermost inorganic layer that seals the electroluminescent element, the first organic layer having a thickness that gradually decreases in the end portions. Moreover, the following processes are performed in sequence: forming the intermediate inorganic layer on the first organic layer; forming the second organic layer on the intermediate inorganic layer, the second organic layer having a thickness that gradually decreases in the end portions; and forming the uppermost inorganic layer to cover the end portions of each of the inorganic layers and the end portions of each of the first and second organic layers. Thus, unlike the conventional examples, the electroluminescent device can reliably suppress the permeation of moisture and have excellent reliability.

In the manufacturing method of the electroluminescent device, each of the inorganic layers may be formed by a CVD method or an ALD method.

In this case, the inorganic layers can easily be formed with high precision.

In the manufacturing method of the electroluminescent device, at least the second organic layer of the first and second organic layers may be formed by an evaporation method or a sputtering method.

In this case, at least the second organic layer can easily be formed with high precision.

In the manufacturing method of the electroluminescent device, the first organic layer may be formed on the electroluminescent element by a wet method.

In this case, the first organic layer can easily be formed with high precision at a low cost.

In the manufacturing method of the electroluminescent device, it is preferable that an inversely tapered mask is used to form the inorganic layers other than the uppermost inorganic layer and the first and second organic layers.

This can simplify the manufacturing processes and shorten the manufacturing time.

Effects of the Invention

The present invention can provide an electroluminescent device that reliably suppresses the permeation of moisture and has excellent reliability, and a method for manufacturing the electroluminescent device.

BRIEF DESCRIPTION OF DRAWINGS

FIG. 5 is a diagram for explaining a mask used in the manufacturing processes of the organic EL display device.

FIG. 6 is a diagram for explaining the main manufacturing processes of the organic EL display device. FIGS. 6A to 6B illustrate a series of the main manufacturing processes.

FIG. 7 is a diagram for explaining the main manufacturing processes of the organic EL display device. FIGS. 7A to 7B illustrate a series of the main manufacturing processes subsequent to the process represented by FIG. 6B.

FIG. 8 is a diagram for explaining the specific effects of the sealing film.

FIG. 10 is an enlarged cross-sectional view illustrating an end portion of the sealing film in FIG. 9.

FIG. 11 is a diagram for explaining the main manufacturing processes of the organic EL display device in FIG. 9. FIGS. 11A to 11B illustrate a series of the main manufacturing processes.

FIG. 12 is a diagram for explaining the main manufacturing processes of the organic EL display device in FIG. 9. FIGS. 12A to 12B illustrate a series of the main manufacturing processes subsequent to the process represented by FIG. 11B.

FIG. 13 is a diagram for explaining the specific effects of the sealing film in FIG. 9.

DESCRIPTION OF THE INVENTION

Figure 1:
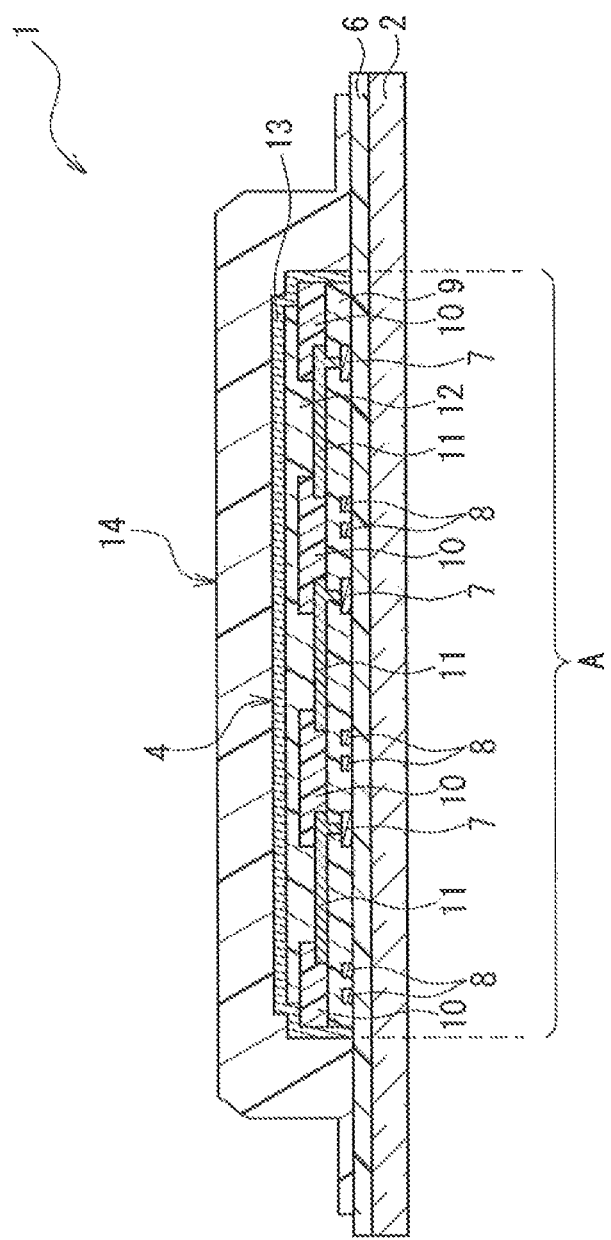
FIG. 1 is a cross-sectional view illustrating an organic EL display device of Embodiment 1 of the present invention.

Hereinafter, preferred embodiments of an electroluminescent device and a method for manufacturing the electroluminescent device of the present invention will be described with reference to the drawings. In the following description, the present invention is applied to an organic EL display device. The size and size ratio of each of the constituent members in the drawings may not exactly represent those of the actual constituent members.

Embodiment 1

FIG. 1 is a cross-sectional view illustrating an organic EL display device of Embodiment 1 of the present invention. In FIG. 1, an organic EL display device 1 of this embodiment includes a TFT substrate (substrate) 2 and an organic EL element (electroluminescent element) 4 provided on the TFT substrate 2.

In the organic EL display device 1 of this embodiment, the organic EL element 4 forms a rectangular pixel region A having a plurality of pixels, and the organic EL element 4 is sealed by a sealing film 14. The pixel region A is a display portion of the organic EL display device 1 and displays information.

Referring back to FIG. 1, the TFT substrate 2 is made of e.g., a glass material. An underlying film (insulating film) 6 is formed on the TFT substrate 2 to cover the entire surface of the TFT substrate 2. TFTs (thin film transistors) 7 are provided on the underlying film 6 so as to correspond to each pixel in the pixel region A. Moreover, lines 8 are formed on the underlying film 6. The lines 8 include a plurality of source lines (signal lines) and a plurality of gate lines that are arranged in a matrix. The source lines are connected to a source driver (not shown) and the gate lines are connected to a gate driver (not shown). With this configuration, the TFTs 7 are driven on a pixel-by-pixel basis in accordance with an external input image signal. The TFTs 7 function as switching elements that control the light emission of the corresponding pixels. Thus, the TFTs 7 control the light emission of any of red (R), green (G), and blue B pixels of the organic EL element 4.

The underlying film 6 prevents the properties of the TFTs 7 from being reduced due to the diffusion of impurities from the TFT substrate 2 to the TFTs 7. If there is no concern for such a reduction in the properties of the TFTs 7, then the formation of the underlying film 6 may be omitted.

An interlayer insulating film 9, an edge cover 10, and a first electrode 11 of the organic EL element 4 are formed on the TFT substrate 2. The interlayer insulating film 9 functions as a planarization film and is formed on the underlying film 6 to cover the TFTs 7 and the lines 8. The edge cover 10 is formed on the interlayer insulating film 9 to cover the pattern edges of the first electrode 11. The edge cover 10 also functions as an insulating layer to prevent a short circuit between the first electrode 11 and a second electrode 13 (as will be described later). Moreover, the first electrode 11 is connected to the TFTs 7 via contact holes provided in the interlayer insulating film 9.

The edge cover 10 has openings, through which the first electrode 11 is exposed, and these portions substantially form light emitting regions of the organic EL element 4. As described above, the organic EL display device 1 of this embodiment is configured to perform full-color display by emitting light of any color of RGB.

An organic EL layer 12 and a second electrode 13 are formed on the first electrode 11. The first electrode 11, the organic EL layer 12, and the second electrode 13 constitute the organic EL element 4. The organic EL element 4 is, e.g., a light emitting element that is driven by low voltage direct current and can emit high-intensity light. The organic EL element 4 includes the first electrode 11, the organic EL layer 12, and the second electrode 13.

Specifically, when the first electrode 11 is a positive electrode, a hole injection layer, a hole transport layer, a light emitting layer, an electron transport layer, an electron injection layer, etc. (not shown) are formed in this order on the first electrode 11 as the organic EL layer 12, on top of which the second electrode (negative electrode) 13 is formed. Other than the above description, a single layer may have two or more functions such as a hole injection and transport layer. Moreover, a carrier blocking layer or the like may be appropriately inserted into the organic EL layer 12.

On the other hand, when the second electrode 13 is a positive electrode, the order in which the layers are stacked as the organic EL layer 12 is reversed.

When the first electrode 11 is a permeable electrode or a semi-permeable electrode, and the second electrode 13 is a reflecting electrode, the organic EL display device 1 is a bottom emission type device that emits light from the TFT substrate 2. On the contrary, when the first electrode 11 is a reflecting electrode, and the second electrode 13 is a permeable electrode or a semi-permeable electrode, the organic EL display device 1 is a top emission type device that emits light from the sealing film 14.

In the organic EL display device 1 of this embodiment, the organic EL element 4 is sealed by the sealing film 14, as described above. The sealing film 14 prevents moisture or oxygen from permeating (entering) the element from the outside, and thus prevents the degradation of the organic EL element 4.

Next, referring also FIGS. 2 to 4, the sealing film 14 of this embodiment will be described in detail.

Figure 2:
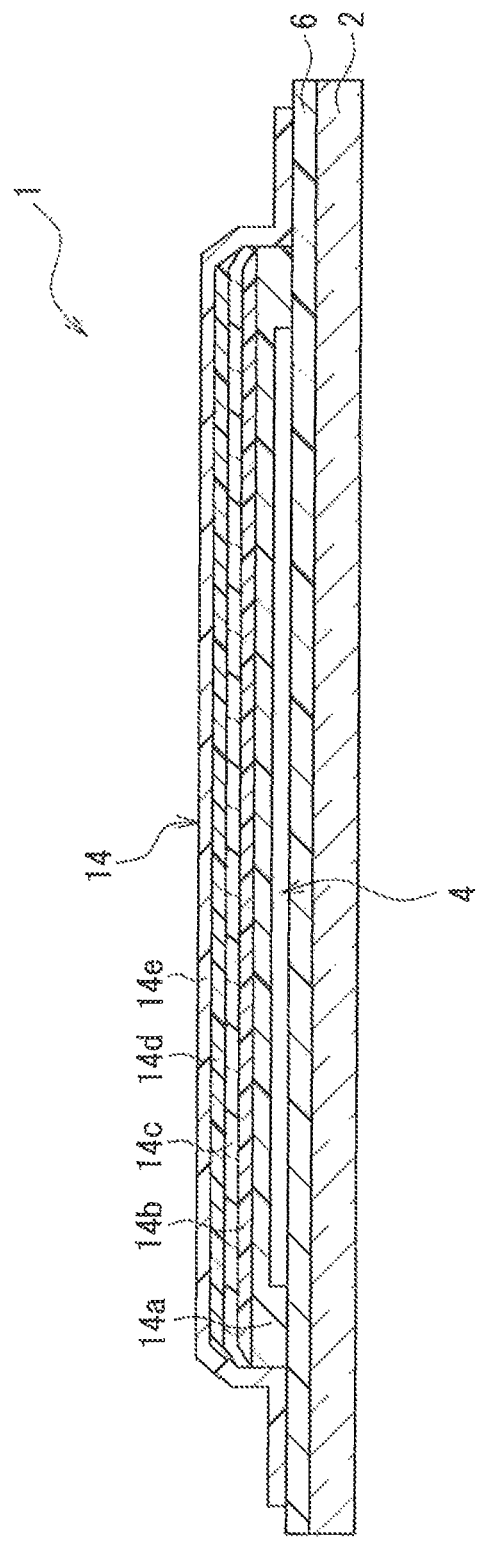
FIG. 2 is a cross-sectional view illustrating a specific configuration of a sealing film in FIG. 1.

FIG. 2 is a cross-sectional view illustrating a specific configuration of the sealing film in FIG. 1. FIG. 3 is an enlarged cross-sectional view illustrating an end portion of the sealing film. FIG. 4 is a top view of the organic EL display device.

As illustrated in FIG. 2, the sealing film 14 of this embodiment includes, e.g., a total of 5 inorganic and organic layers. Each of the inorganic layers and each of the organic layers are alternately arranged. In the sealing film 14 of this embodiment, a first inorganic layer 14a is provided to cover the organic EL element 4. A first organic layer 14b is provided on the first inorganic layer 14a, and a second inorganic layer 14c is provided on the first organic layer 14b. Moreover, a second organic layer 14d is provided on the second inorganic layer 14c, and a third inorganic layer 14e is provided on the second organic layer 14d.

In the sealing film 14, the third inorganic layer 14e, which is the uppermost inorganic layer, is provided to cover the end portions of the lower first and second inorganic layers 14a, 14c and the end portions of the lower first and second organic layers 14b, 14d. In other words, the sealing film 14 is configured so that the inner surface of the third inorganic layer 14e is in contact with the end faces of each of the first and second inorganic layers 14a, 14c and the end faces of each of the first and second organic layers 14b, 14d.

The first, second, and third inorganic layers 14a, 14c, 14e are formed so that their thickness does not gradually decrease in the end portions. In each of the first, second, and third inorganic layers 14a, 14c, 14e, the thickness of the end portions is substantially the same as the thickness of the portion located on the organic EL element 4 (corresponding to the portion in the pixel region A, which is referred to as a central portion in the following).

Figure 3:
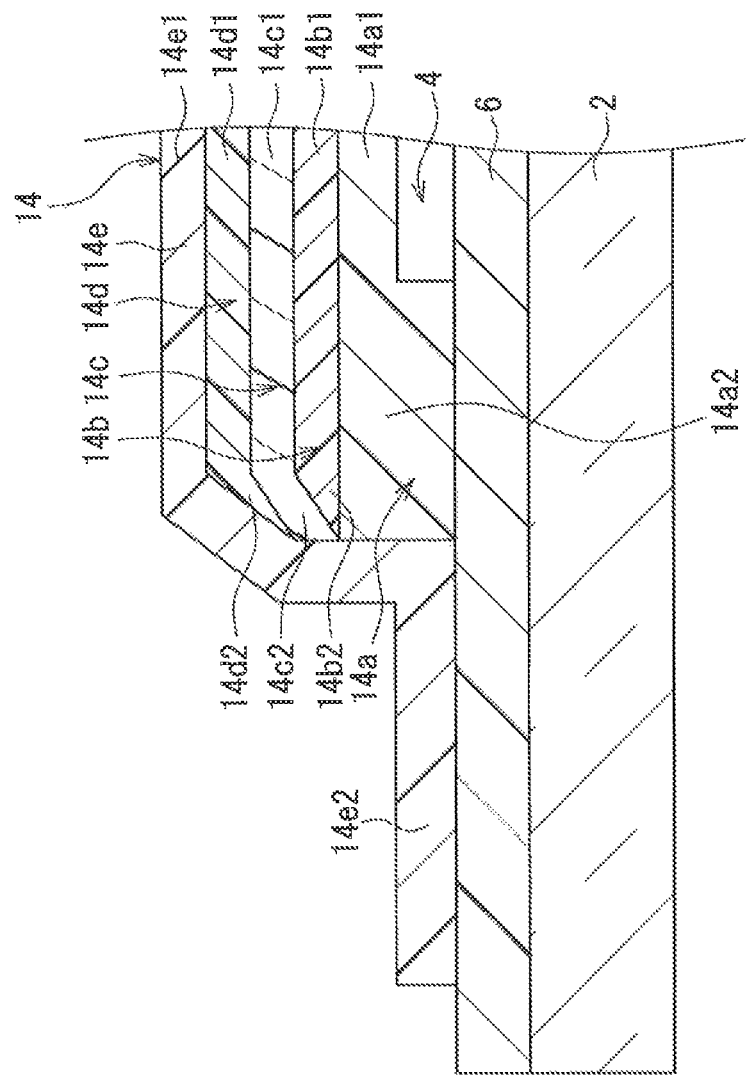
FIG. 3 is an enlarged cross-sectional view illustrating an end portion of the sealing film.

Specifically, although the influence of the thickness of the organic EL element 4 on the first inorganic layer 14a is schematically illustrated in FIG. 3, the first inorganic layer 14a is formed along the step of the underlayer, and therefore has substantially the same thickness in an end portion 14a2 and a central portion 14a1. The second inorganic layer 14c is formed to have substantially the same thickness, and therefore the thickness of a central portion 14c1 is substantially the same as that of an end portion 14c2. Similarly, the third inorganic layer 14e is formed to have substantially the same thickness, and therefore the thickness of a central portion 14e1 is substantially the same as that of an end portion 14e2.

Each of the first, second, and third inorganic layers 14a, 14c, 14e may be an inorganic film of, e.g., silicon nitride, silicon oxide, silicon oxynitride, or $Al_2O_3$.

The first and second organic layers 14b, 14d are formed so that their thickness gradually decreases in the end portions, while it is substantially uniform in the central portion. In each of the first and second organic layers 14b, 14d, the thickness of the end portions gradually decreases and becomes thinner from the thickness of the central portion (i.e., the portion located on the organic EL element 4).

Specifically, as illustrated in FIG. 3, the first organic layer 14b is formed so that the thickness of an end portion 14b2 gradually decreases from the thickness of a central portion 14b1. The second organic layer 14d is formed so that the thickness of an end portion 14d2 gradually decreases from the thickness of a central portion 14d1.

Moreover, the thickness of the end face of the end portion 14b2 of the first organic layer 14b and the thickness of the end face of the end portion 14d2 of the second organic layer 14d are adjusted, e.g., in the range of several to several tens of nm. Thus, the first organic layer 14b prevents the first and second inorganic layers 14a, 14c from being stacked in direct contact with each other, as much as possible. The second organic layer 14d prevents the second and third inorganic layers 14c, 14e from being stacked in direct contact with each other, as much as possible. In other words, the first organic layer 14b prevents the second inorganic layer 14c from being superimposed on the first inorganic layer 14a in the direction perpendicular to the surface of the TFT substrate 2. The second organic layer 14d prevents the third inorganic layer 14e from being superimposed on the second inorganic layer 14c in the direction perpendicular to the surface of the TFT substrate 2.

As illustrated in FIG. 3, the first and second organic layers 14b, 14d are formed above the TFT substrate 2 so that the end face of the end portion 14b2 is aligned with the end face of the end portion 14d2.

Figure 4:
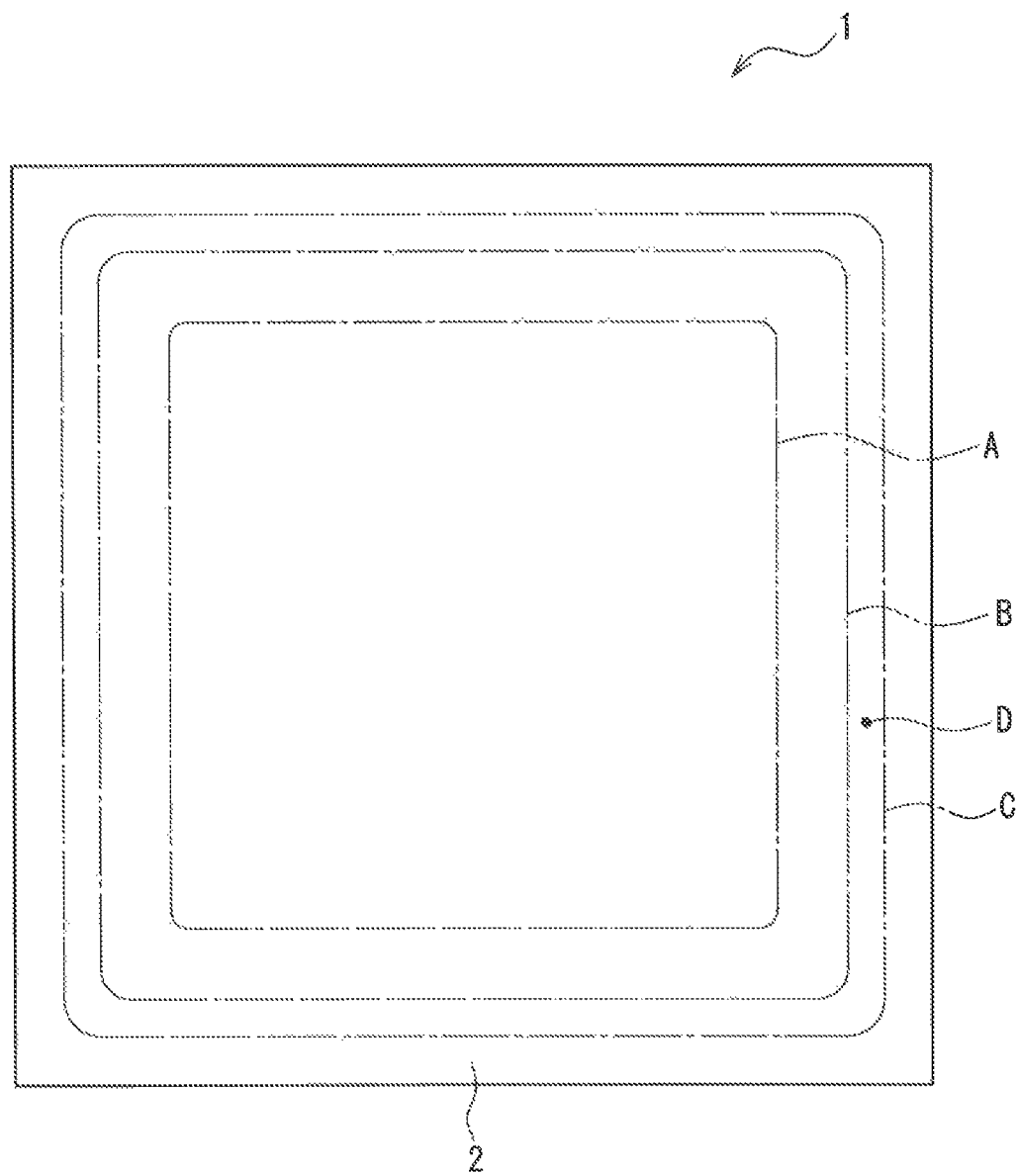
FIG. 4 is a top view of the organic EL display device.

As illustrated in FIG. 4, a gradual decrease region D in which the thickness of each of the first and second organic layers 14b, 14d gradually decreases is provided in an outer region of the organic EL element 4 on the TFT substrate 2. In other words, the first and second organic layers 14b, 14d have a substantially uniform thickness in a uniform region and an intermediate region. The uniform region contains the central portions 14b1, 14d1 and corresponds to the rectangular pixel region A. The intermediate region extends outward to a predetermined distance from the uniform region, as indicated by the alternate long and short dash line B in FIG. 4. Moreover, both the end face of the end portion 14b2 and the end face of the end portion 14d2 are located outside the uniform region and the intermediate region, as indicated by the alternate long and short dash line C in FIG. 4. The gradual decrease region D is provided in the outer region of the pixel region A (the organic EL element 4).

Each of the first and second organic layers 14b, 14d may be an organic film of e.g., acrylate, polyuria, parylene, polyimide, or polyamide.

In the sealing film 14 of this embodiment, the first and second inorganic layers 14a, 14c and the first and second organic layers 14b, 14d are formed on the TFT substrate 2 by using a single mask, as will be described in detail later.

Next, referring to FIGS. 5 to 7, a method for manufacturing the organic EL display device 1 of this embodiment will be described in detail. The following description is mainly about a method for forming the sealing film 14 of this embodiment.

Figure 5A:
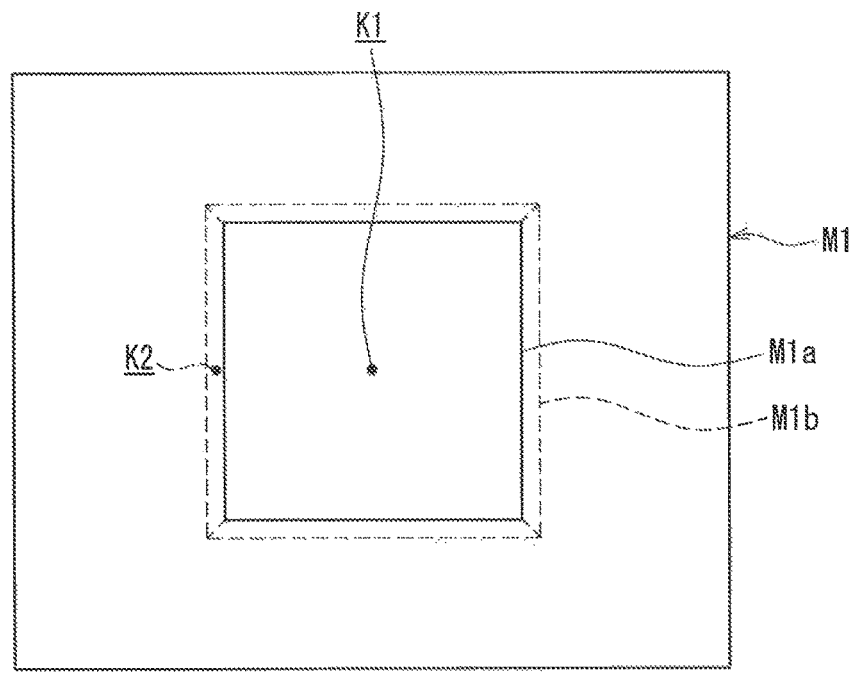
FIG. 5A is a plan view of a first mask used in the formation processes of organic layers and inorganic layers other than the uppermost inorganic layer.
Figure 5B:
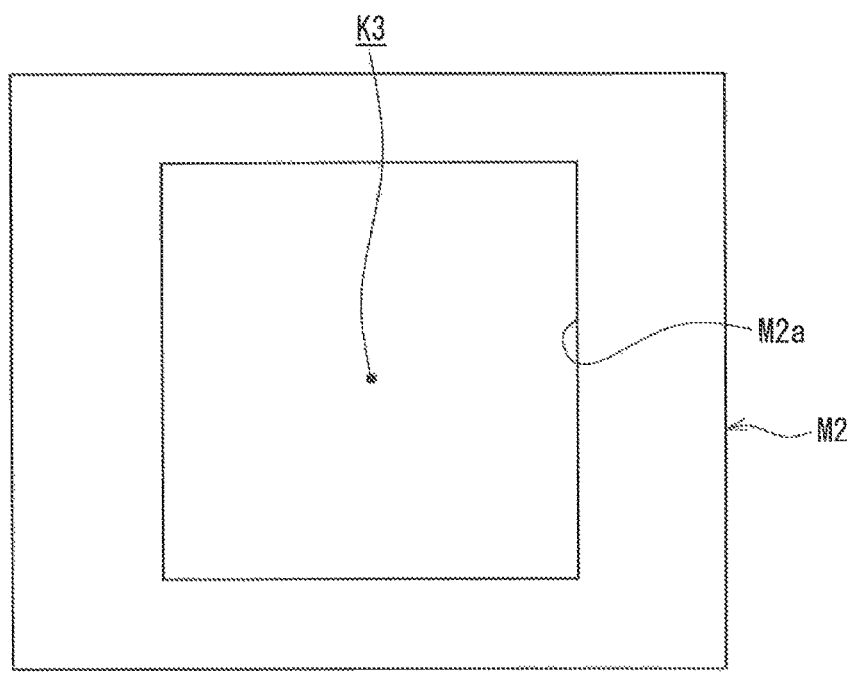
FIG. 5B is a plan view of a second mask used in the formation process of the uppermost inorganic layer.

FIG. 5 is a diagram for explaining a mask used in the manufacturing processes of the organic EL display device. FIG. 5A is a plan view of a first mask used in the formation processes of the organic layers and the inorganic layers other than the uppermost inorganic layer. FIG. 5B is a plan view of a second mask used in the formation process of the uppermost inorganic layer. FIG. 6 is a diagram for explaining the main manufacturing processes of the organic EL display device. FIGS. 6A to 6B illustrate a series of the main manufacturing processes. FIG. 7 is a diagram for explaining the main manufacturing processes of the organic EL display device. FIGS. 7A to 7B illustrate a series of the main manufacturing processes subsequent to the process represented by FIG. 6B.

First, referring to FIG. 5, two (deposit) masks M1, M2 used in the manufacturing processes of the sealing film 14 of this embodiment will be described in detail.

In FIG. 5A, the mask M1 is used in the formation processes of the first and second inorganic layers 14a, 14c and the first and second organic layers 14b, 14d. The mask M1 is inversely tapered. This means that a hole in the mask M1 gradually widens when it is viewed from the direction in which materials (e.g., a film forming gas) are supplied. Specifically, as illustrated in FIG. 5A, the mask M1 has an opening K1 defined by four sides M1a in the surface that faces the direction from which the materials are supplied during the film formation. Moreover, the mask M1 has an opening K2 defined by four sides M1b in the surface that faces the TFT substrate 2 during the film formation. Comparing the openings K1 and K2, the opening K2 facing the TFT substrate 2 is larger in size than the opening K1, so that the mask M1 is inversely tapered. In other words, the hole in the mask M1 has an inversely tapered cross section, e.g., as illustrated in FIG. 6A, which will be described later.

In FIG. 5B, the mask M2 is used in the formation process of the third inorganic layer 14e, and has a uniform opening K3. As illustrated in FIG. 5B, the mask M2 has the opening K3 defined by four sides M2a. The opening K3 is larger in size than the openings K1 and K2 of the mask M1.

Next, referring to FIGS. 6 and 7, the specific formation processes of the sealing film 14 of this embodiment will be described.

As illustrated in FIG. 6A, in the organic EL display device 1 of this embodiment, first, a formation process is performed to form the first inorganic layer 14a on the organic EL element 4 provided on the TFT substrate 2. Specifically, as illustrated in FIG. 6A, the mask M1 is placed on the underlying film 6 of the TFT substrate 2 so that the lower surface having the sides M1b faces the TFT substrate 2, and the organic EL element 4 is arranged within the opening K2. Then, the first inorganic layer 14a is formed to cover the organic EL element 4 by, e.g., a CVD (chemical vapor deposition) method or an ALD (atomic layer deposition) method.

Since the CVD method and the ALD method achieve a high coverage, the use of these methods can easily form the first inorganic layer 14a with high precision so that the height of the first inorganic layer 14a from the underlayer is constant (the same is true for the second and third inorganic layers 14c, 14e).

Next, as illustrated in FIG. 6B, a formation process is performed to form the first organic layer 14b, having a thickness that gradually decreases in the end portions, on the first inorganic layer 14a (the lowermost layer) that seals the organic EL element 4. In this process, the mask M1 is used in the same manner as the process in FIG. 6A, and the first organic layer 14b is formed on the first inorganic layer 14a by, e.g., an evaporation method or a sputtering method.

In the evaporation method and the sputtering method, the particles to be deposited have directional properties in the flight direction. Therefore, when the inversely tapered mask M1 is used, the particles flying from the inside of the upper opening K1 (defined by the sides M1a of the upper surface of the mask M1) contribute to the formation of the film, e.g., on the left end of the opening K1, while the particles flying from the outside of the opening K1 do not contribute to the formation of the film on the left end of the opening K1. Because of this phenomenon, the first organic layer 14b having a thickness that gradually decreases in the end portions can easily be formed with high precision (the same is true for the second organic layer 14d).

Subsequently, as illustrated in FIG. 7A, a formation process is performed to form the second inorganic layer 14c as an intermediate layer on the first organic layer 14b, and a formation process is performed to form the second organic layer 14d, having a thickness that gradually decreases in the end portions, on the second inorganic layer 14c. In these processes, the mask M1 is used in the same manner as the process in FIG. 6A and the second inorganic layer 14c is formed on the first organic layer 14b by, e.g., the CVD method or the ALD method. Moreover, the second organic layer 14d is formed on the second inorganic layer 14c by, e.g., the evaporation method or the sputtering method. The formation process of the second inorganic layer 14c uses the CVD method or the ALD method, and therefore can form the second inorganic layer 14c having a substantially uniform thickness even with the use of the mask M1.

In the formation processes of the first and second organic layers 14b, 14d, the degree of gradual decrease in the thickness can be controlled by adjusting the taper angle of the mask M1 (i.e., the angle between the side M1a and the side M1b). A gradual decrease in the thickness of the organic layer in the end portions can also be controlled by, e.g., adjusting the position of the source of supply of the particles to be deposited (such as so-called oblique evaporation in which the particles are deposited obliquely with respect to the opening K1). In this case, the inversely tapered mask M1 is not necessarily needed.

If the thickness of each of the first and second organic layers 14b, 14d gradually decreases in the end portions by adjusting, e.g., the type of gas, the amount of gas, the pressure, or the structure in a film forming chamber, the formation processes of the first and second organic layers 14b, 14d may also use the CVD method or the ALD method as with the formation processes of the first, second, and third inorganic layers 14a, 14c, 14e. In such a case, the first, second, and third inorganic layers 14a, 14c, 14e and the first and second organic layers 14b, 14d can be consistently formed in the same film forming chamber. This can improve the throughput and reduce foreign matter from entering when the film forming chamber is replaced.

Next, as illustrated in FIG. 7B, a formation process is performed to form the third inorganic layer 14e (the uppermost layer) to cover the end portions of each of the first and second inorganic layers 14a, 14c and the end portions of each of the first and second organic layers 14b, 14d. Specifically, as illustrated in FIG. 7B, the mask M2 is placed on the underlying film 6 of the TFT substrate 2 so that the first and second inorganic layers 14a, 14c and the first and second organic layers 14b, 14d are arranged within the opening K3. Then, the third inorganic layer 14e is formed to cover the end portions of each of the first and second inorganic layers 14a, 14c and the end portions of each of the first and second organic layers 14b, 14d by, e.g., the CVD method or the ALD method.

The organic EL display device 1 of this embodiment is completed by the manufacturing processes as described above.

In the organic EL display device 1 of this embodiment having the above configuration, the sealing film 14 is composed of the first and second organic layers 14b, 14d and the first, second, and third inorganic layers 14a, 14c, 14e, and the first and second organic layers 14b, 14d and the first, second, and third inorganic layers 14a, 14c, 14e are alternately arranged. The first and second organic layers 14b, 14d are formed so that the thickness gradually decreases in the end portions 14b2, 14d2, respectively. The uppermost layer of the sealing film 14 of this embodiment is the third inorganic layer 14e, and the third inorganic layer 14e is provided to cover the end portions 14b2, 14d2 of the lower first and second organic layers 14b, 14d and the end portions 14a2, 14c2 of the lower first and second inorganic layers 14a, 14c. Thus, unlike the conventional examples, the organic EL display device (electroluminescent device) 1 of this embodiment can reliably suppress the permeation of moisture and have excellent reliability.

Next, referring to FIG. 8, the specific effects of the sealing film 14 of this embodiment will be described.

Figure 8A:
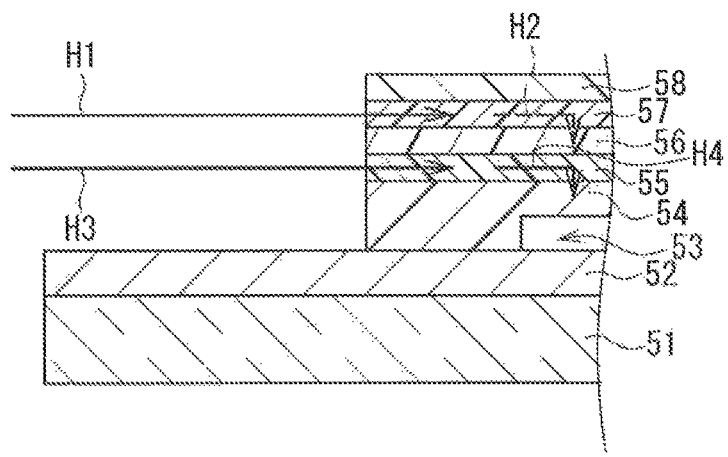
FIG. 8A illustrates specific problems in Comparative Example 1.
Figure 8B:
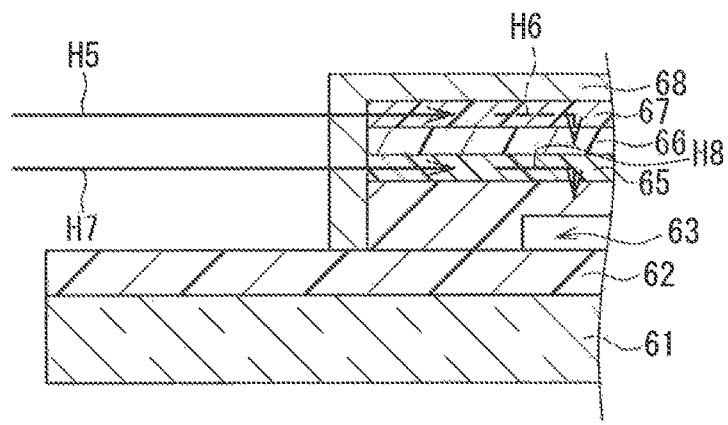
FIG. 8B illustrates specific problems in Comparative Example 2.
Figure 8C:
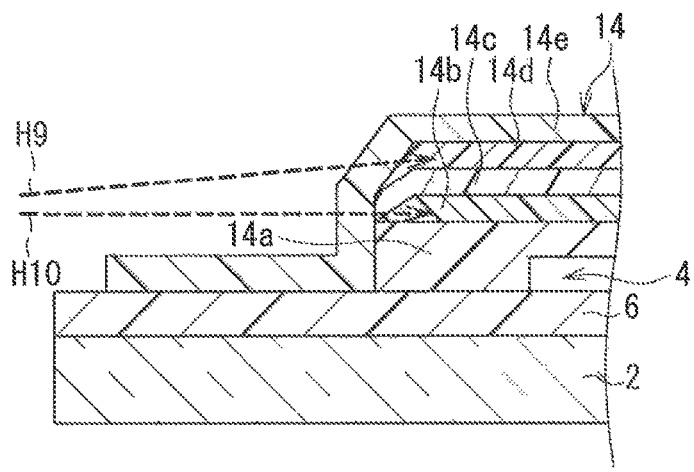
FIG. 8C illustrates the specific effects of the sealing film.

FIG. 8 is a diagram for explaining the specific effects of the sealing film. FIG. 8A illustrates specific problems in Comparative Example 1. FIG. 8B illustrates specific problems in Comparative Example 2. FIG. 8C illustrates the specific effects of the sealing film.

As illustrated in FIG. 8A, in Comparative Example 1, an underlying film 52 and an organic EL element 53 are provided in this order on a TFT substrate 51. A first inorganic layer 54 is provided to cover the organic EL element 53. A first organic layer 55, a second inorganic layer 56, a second organic layer 57, and a third inorganic layer 58 are provided in this order on the first inorganic layer 54. Moreover, the end faces of each of the first and second organic layers 55, 57 are exposed to the outside.

In Comparative Example 1, moisture easily enters the first and second organic layers 55, 57 through the exposed end faces and permeates the organic EL element (pixel region) 53.

Specifically, moisture enters the second organic layer 57 from the outside through an end face, as indicated by the arrow H1 in FIG. 8A. When the moisture reaches the portion of the second organic layer 57 that is located above the organic EL element 53, it is blocked by the lower second inorganic layer 56, as indicated by the arrow H2 in FIG. 8A. Even if the second inorganic layer 56 has pinholes, the moisture is dispersed into the first organic layer 55 and is further blocked by the first inorganic layer 54. Thus, in order for the moisture indicated by the arrow H1 to reach the organic EL element 53, the moisture has to be dispersed in the second organic layer 57, to pass through the pinholes in the second inorganic layer 56, to be dispersed in the first organic layer 55, and then to pass through pinholes in the first inorganic layer 54.

On the other hand, when moisture enters the first organic layer 55 through an end face, as indicated by the arrow H3 in FIG. 8A, the moisture passes through the pinholes in the first inorganic layer 54 and easily reaches the organic EL element 53, resulting in damage to the organic EL element 53. Although it takes time for the moisture that has entered from the end face of the second organic layer 57 to reach the organic EL element 53, the moisture that has entered from the end face of the first organic layer 55 quickly damages the organic EL element 53.

As illustrated in FIG. 8B, in Comparative Example 2, an underlying film 62 and an organic EL element 63 are provided in this order on a TFT substrate 61. A first inorganic layer 64 is provided to cover the organic EL element 63. A first organic layer 65, a second inorganic layer 66, and a second organic layer 67 are provided in this order on the first inorganic layer 64. Moreover, a third inorganic layer 68 is provided to cover the end faces of each of the first and second inorganic layers 64, 66 and the end faces of each of the first and second organic layers 65, 67.

In Comparative Example 2, moisture does not enter the second organic layer 67, and therefore does not reach the portion of the second organic layer 67 that is located above the organic EL element 63 unless the moisture passes through pinholes in the third inorganic layer 68, as indicated by the arrow H5 in FIG. 8B. Even if the moisture reaches the portion of the second organic layer 67 that is located above the organic EL element 63, it is blocked by the lower second inorganic layer 66, as indicated by the arrow H6 in FIG. 8B. Therefore, Comparative Example 2 reduces the moisture penetration compared to that indicated by the arrow H1 in FIG. 8A.

In Comparative Example 2, moisture does not enter the first organic layer 65 unless the moisture passes through pinholes in the third inorganic layer 68, as indicated by the arrow H7 in FIG. 8B. Therefore, Comparative Example 2 reduces the moisture penetration compared to that indicated by the arrow H3 in FIG. 8A.

However, if moisture passes through the pinholes in the third inorganic layer 68, the moisture is easily dispersed into the first organic layer 65, passes through pinholes in the first inorganic layer 64, and reaches the organic EL element 63, as indicated by the arrow H8 in FIG. 8B. Consequently, Comparative Example 2 is not sufficient to suppress the damage to the organic EL element 63.

In this embodiment, since the thickness of the second organic layer 14d is small in the end portion 14d2 (FIG. 3), even if the third inorganic layer 14e has pinholes, the dispersion of moisture in the second organic layer 14d is significantly restricted, as indicated by the arrow H9 in FIG. 8C. Therefore, this embodiment can further reduce the moisture penetration indicated by the arrow H9 in FIG. 8C.

In this embodiment, moisture cannot enter the first organic layer 14b unless the moisture passes through not only the third inorganic layer 14e, but also the second inorganic layer 14c, as indicated by the arrow H10 in FIG. 8C. Moreover, even if the third inorganic layer 14e has pinholes, the moisture is blocked by the second inorganic layer 14c. Thus, this embodiment can sufficiently suppress the damage to the organic EL element 4.

In this embodiment, due to the presence of the third inorganic layer 14e, moisture cannot reach the first organic layer 14b (i.e., the layer other than the uppermost second organic layer 14d) unless the moisture passes through both the second inorganic layer 14c and the third inorganic layer 14e. Therefore, even if the third inorganic layer 14e has pinholes, this embodiment can effectively suppress the permeation of moisture.

In this embodiment, there is no portion where two or more inorganic layers are stacked in direct contact with each other. Therefore, the inorganic layers do not easily peel off due to stress, which can improve the reliability of the organic EL display device 1.

In this embodiment, the gradual decrease region D in which the thickness of each of the first and second organic layers 14b, 14d gradually decreases is provided in the outer region of the organic EL element 4 on the TFT substrate 2. Thus, this embodiment can reliably prevent not only a reduction in the reliability of the sealing film 14, but also a reduction in the reliability of the organic EL display device 1, and also can prevent a reduction in the performance of the electroluminescent device (e.g., the display quality of the organic EL display device 1). In the electroluminescent device with a top emission structure, if the gradual decrease region D overlaps the region of the organic EL element 4, the emitted light has to pass through the sealing film having the thickness that differs from region to region. Accordingly, the optical properties such as transmittance and viewing angle characteristics differ depending on the display region (or the light emission region etc.), so that the performance of the electroluminescent device (e.g., the display quality of the organic EL display device 1 or the light emission quality of an organic EL illumination device) is reduced. However, since the gradual decrease region D is provided in the outer region of the organic EL element 4 on the TFT substrate 2, the optical properties in the display region (or the light emission region etc.) are uniform, and thus the performance of the electroluminescent device will not be reduced.

A method for manufacturing the organic EL display device 1 of this embodiments includes the following: forming the first inorganic layer 14a on the organic EL element 4 provided on the TFT substrate 2; forming the first organic layer 14b on the first inorganic layer 14a so that the thickness of the first organic layer 14b gradually decreases in the end portions; forming the second inorganic layer 14c as the intermediate layer on the first organic layer 14b; forming the second organic layer 14d on the second inorganic layer 14c so that the thickness of the second organic layer 14d gradually decreases in the end portions; and forming the third inorganic layer 14e as the uppermost layer to cover the end portions of each of the first and second inorganic layers 14a, 14c and the end portions of each of the first and second organic layers 14b, 14d. Thus, unlike the conventional examples, the organic EL display device 1 of this embodiment can reliably suppress the permeation of moisture and have excellent reliability.

In this embodiment, the inversely tapered mask M1 is used in the formation processes of the first and second inorganic layers 14a, 14c other than the third inorganic layer 14e (the uppermost layer) and the first and second organic layers 14b, 14d. Thus, this embodiment can simplify the manufacturing processes and shorten the manufacturing time.

Embodiment 2

Figure 9:
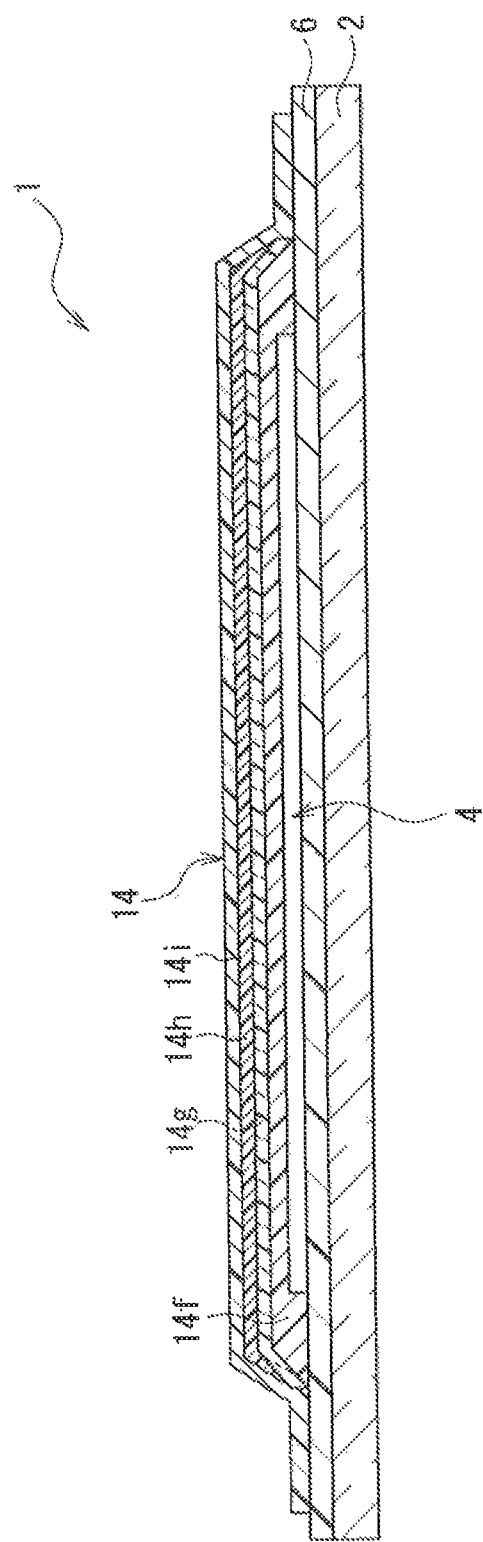
FIG. 9 a cross-sectional view illustrating a specific configuration of a sealing film in an organic EL display device of Embodiment 2 of the present invention.

FIG. 9 is a cross-sectional view illustrating a specific configuration of a sealing film in an organic EL display device of Embodiment 2 of the present invention. FIG. 10 is an enlarged cross-sectional view illustrating an end portion of the sealing film in FIG. 9.

In FIGS. 9 and 10, this embodiment mainly differs from Embodiment 1 in that the sealing film includes a first organic layer provided on an organic EL element, a first inorganic layer and a second organic layer provided on the first organic layer, and a second inorganic layer as the uppermost inorganic layer. The same components as those of Embodiment 1 are denoted by the same reference numerals, and the explanation will not be repeated.

As illustrated in FIGS. 9 and 10, in an organic EL display device 1 of this embodiment, a sealing film 14 seals an organic EL element 4 and includes, e.g., a total of 4 inorganic and organic layers. Each of the inorganic layers and each of the organic layers are alternately arranged. In the sealing film 14 of this embodiment, a first organic layer 14*f* is provided to cover the organic EL element 4. A first inorganic layer 14*g* is provided on the first organic layer 14*f* and a second organic layer 14*h* is provided on the first inorganic layer 14*g*. Moreover, a second inorganic layer 14*i* is provided on the second organic layer 14*h*.

In the sealing film 14, the second inorganic layer 14*i*, which is the uppermost inorganic layer, is provided to cover the end portions of the lower first inorganic layer 14*g* and the end portions of the lower first and second organic layers 14*f*, 14*h*. In other words, the sealing film 14 is configured so that the inner surface of the second inorganic layer 14*i* is in contact with the end faces of the first inorganic layer 14*g* and the end faces of each of the first and second organic layers 14*f*, 14*h*.

The first and second inorganic layers 14*g*, 14*i* are formed so that their thickness does not gradually decrease in the end portions. In each of the first and second inorganic layers 14*g*, 14*i*, the thickness of the end portions is substantially the same as the thickness of the central portion (i.e., the portion located on the organic EL element 4).

Specifically, as illustrated in FIG. 10, the first inorganic layer 14*g* is formed to have substantially the same thickness, and therefore the thickness of a central portion 14*g*1 is substantially the same as that of an end portion 14*g*2. Similarly, the second inorganic layer 14*i* is formed to have substantially the same thickness, and therefore the thickness of a central portion 14*i*1 is substantially the same as that of an end portion 14*i*2.

As with the inorganic layers in Embodiment 1, each of the first and second inorganic layers 14*g*, 14*i* may be an inorganic film of, e.g., silicon nitride, silicon oxide, silicon oxynitride, or $Al_2O_3$.

The first and second organic layers 14*f*, 14*h* are formed so that their thickness gradually decreases in the end portions, while it is substantially uniform in the central portion. In each of the first and second organic layers 14*f*, 14*h*, the thickness of the end portions gradually decreases from the thickness of the portion inside the end portions.

Specifically, as illustrated in FIG. 10, the first organic layer 14*f* has a predetermined intermediate region between a central portion 14*f*1 and an end portion 14*f*2. The thickness of the first organic layer 14*f* in the intermediate region is determined by adding the thickness of the organic EL element 4 covered with the first organic layer 14*f* and the substantially uniform thickness of the central portion 14*f*1.

The thickness of the end portion 14*f*2 gradually decreases from the thickness in the intermediate region. The second organic layer 14*h* is formed so that the thickness of an end portion 14*h*2 gradually decreases from the thickness of a central portion 14*h*1. Thus, unlike the intermediate region of each of the first and second organic layers 14*b*, 14*d* in Embodiment 1, the thickness of the first organic layer 14*f* in the intermediate region is larger than that of the central portion 14*f*1.

As with the organic layers in Embodiment 1, the thickness of the end face of the end portion 14*f*2 of the first organic layer 14*f* and the thickness of the end face of the end portion 14*h*2 of the second organic layer 14*h* are adjusted, e.g., in the range of several to several tens of nm. Thus, the second organic layer 14*h* prevents the first and second inorganic layers 14*g*, 14*i* from being stacked on one another, as much as possible. In other words, the second organic layer 14*h* prevents the second inorganic layer 14*i* from being superimposed on the first inorganic layer 14*g* in the direction perpendicular to the surface of the TFT substrate 2.

As illustrated in FIG. 10, the first and second organic layers 14*f*, 14*h* are formed above the TFT substrate 2 so that the end face of the end portion 14*f*2 is aligned with the end face of the end portion 14*h*2.

Other than the above description, the position of the end face of the end portion 14*f*2 of the first organic layer 14*f* may be closer to the organic EL element 4 than that of the end face of the end portion 14*h*2 of the second organic layer 14*h*.

As with the organic layers in Embodiment 1, each of the first and second organic layers 14*f*, 14*h* may be an organic film of, e.g., acrylate, polyuria, parylene, polyimide, or polyamide.

Next, referring to FIGS. 11 and 12, a method for manufacturing the organic EL display device 1 of this embodiment will be described in detail. The following description is mainly about a method for forming the sealing film 14 of this embodiment.

FIG. 11 is a diagram for explaining the main manufacturing processes of the organic EL display device in FIG. 9. FIGS. 11A to 11B illustrate a series of the main manufacturing processes. FIG. 12 is a diagram for explaining the main manufacturing processes of the organic EL display device in FIG. 9. FIGS. 12A to 12B illustrate a series of the main manufacturing processes subsequent to the process represented by FIG. 11B.

As illustrated in FIG. 11A in the organic EL display device 1 of this embodiment, first, a formation process is performed to form the first organic layer 14*f* having a thickness that gradually decreases in the end portions, on the organic EL element 4 provided on the TFT substrate 2. In this process, unlike the process in Embodiment 1, the first organic layer 14*f* is formed by a wet method such as a printing method rather than using the mask M1.

In the wet method, a liquid precursor of the organic layer is applied and then set by UV exposure or a heat treatment (cure bake treatment), thereby forming the first organic layer 14*f*. The material for the precursor may be a UV resin or an epoxy resin. Since the material is in the form of a liquid, it can be shaped to have a smooth end portion in which the thickness gradually decreases due to the surface tension. The shape of the end portion in which the thickness gradually decreases can also be controlled by a repetition of the flow of the material during the heat treatment.

Other than the above description, similarly to Embodiment 1, the first organic layer 14*f* may be formed by, e.g., the evaporation method or the sputtering method using the mask M1.

Next, as illustrated in FIG. 11B, a formation process is performed to form the first inorganic layer 14g as an intermediate layer on the first organic layer 14f. In this process, the mask M1 is used in the same manner as the process in FIG. 6A, and the first inorganic layer 14g is formed on the first organic layer 14f by, e.g., the CVD method or the ALD method. The formation process of the first inorganic layer 14g uses the CVD method or the ALD method, and therefore can form the first inorganic layer 14g having a substantially uniform thickness even with the use of the mask M1.

Subsequently, as illustrated in FIG. 12A, a formation process is performed to form the second organic layer 14h, having a thickness that gradually decreases in the end portions, on the first inorganic layer 14g. In this process, the mask M1 is used in the same manner as the process in FIG. 11B, and the second organic layer 14h is formed on the first inorganic layer 14g by, e.g., the evaporation method or the sputtering method.

Next, as illustrated in FIG. 12B, a formation process is performed to form the second inorganic layer 14i (the uppermost layer) to cover the end portions of the first inorganic layer 14g and the end portions of each of the first and second organic layers 14f, 14h. In this process, the mask M2 is used in the same manner as the process in FIG. 7B. Then, the second inorganic layer 14i is formed to cover the end portions of the first inorganic layer 14g and the end portions of each of the first and second organic layers 14f, 14h by, e.g., the CVD method or the ALD method.

The organic EL display device 1 of this embodiment is completed by the manufacturing processes as described above.

With the above configuration, this embodiment can have the same effects as those of Embodiment 1.

Next, referring to FIG. 13, the specific effects of the sealing film 14 of this embodiment will be described.

Figure 13A:
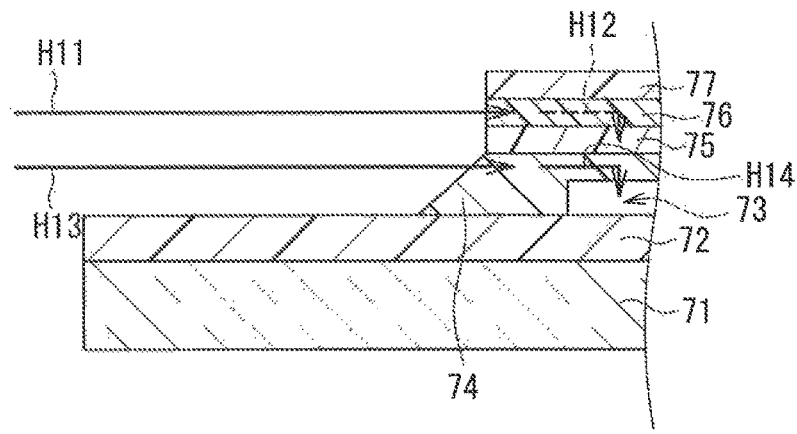
FIG. 13A illustrates specific problems in Comparative Example 3.
Figure 13B:
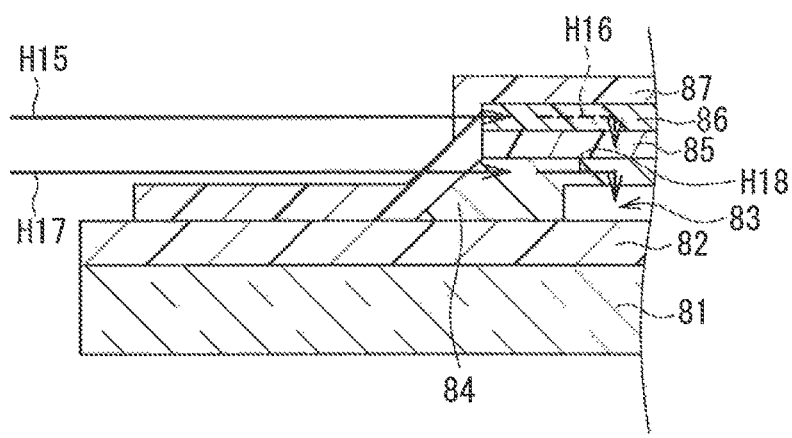
FIG. 13B illustrates specific problems in Comparative Example 4.
Figure 13C:
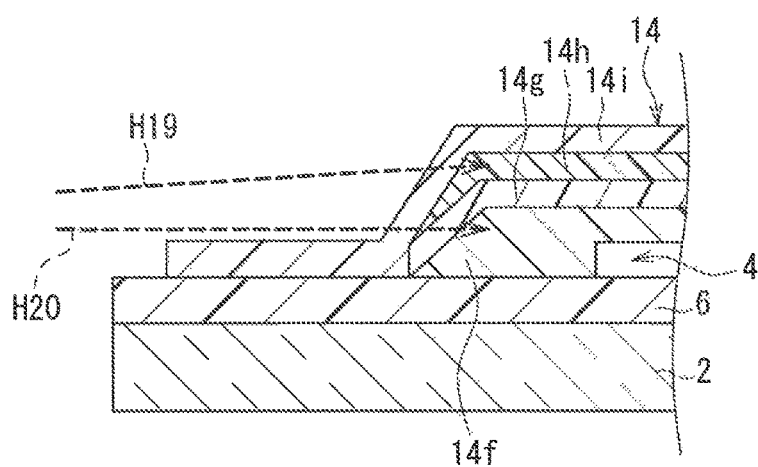
FIG. 13C illustrates the specific effects of the sealing film in FIG. 9.

FIG. 13 is a diagram for explaining the specific effects of the sealing film in FIG. 9. FIG. 13A illustrates specific problems in Comparative Example 3. FIG. 13B illustrates specific problems in Comparative Example 4. FIG. 13C illustrates the specific effects of the sealing film in FIG. 9.

As illustrated in FIG. 13A, in Comparative Example 3, an underlying film 72 and an organic EL element 73 are provided in this order on a TFT substrate 71. A first organic layer 74 is provided to cover the organic EL element 73. A first inorganic layer 75, a second organic layer 76, and a second inorganic layer 77 are provided in this order on the first organic layer 74. Moreover, the end faces of each of the first and second organic layers 74, 76 are exposed to the outside.

In Comparative Example 3, moisture easily enters the first and second organic layers 74, 76 through the exposed end faces and permeates the organic EL element (pixel region) 73.

Specifically, moisture enters the second organic layer 76 from the outside through an end face, as indicated by the arrow H11 in FIG. 13A. When the moisture reaches the portion of the second organic layer 76 that is located above the organic EL element 73, it is blocked by the lower first inorganic layer 75, as indicated by the arrow H12 in FIG. 13A. Even if the first inorganic layer 75 has pinholes, the moisture is dispersed into the first organic layer 74 before reaching the organic EL element 73. Thus, in order for the moisture indicated by the arrow H11 to reach the organic EL element 73, the moisture has to be dispersed in the second organic layer 76, to pass through the pinholes in the first inorganic layer 75, and then to be dispersed in the first organic layer 74.

On the other hand, when moisture enters the first organic layer 74 through an end face, as indicated by the arrow H13 in FIG. 13A, the moisture rapidly permeates the first organic layer 74 and easily reaches the organic EL element 73, resulting in damage to the organic EL element 73. Although it takes time for the moisture that has entered from the end face of the second organic layer 76 to reach the organic EL element 73, the moisture that has entered from the end face of the first organic layer 74 quickly damages the organic El element 73.

As illustrated in FIG. 13B, in Comparative Example 4, an underlying film 82 and an organic EL element 83 are provided in this order on a TFT substrate 81. A first organic layer 84 is provided to cover the organic EL element 83. A first inorganic layer 85 and a second organic layer 86 are provided in this order on the first organic layer 84. Moreover, a second inorganic layer 87 is provided to cover the end faces of each of the first and second organic layers 84, 86 and the end faces of the first inorganic layer 85.

In Comparative Example 4, moisture does not enter the second organic layer 86, and therefore does not reach the portion of the second organic layer 86 that is located above the organic EL element 83 unless the moisture passes through pinholes in the second inorganic layer 87, as indicated by the arrow H15 in FIG. 13B. Even if the moisture reaches the portion of the second organic layer 86 that is located above the organic EL element 83, it is blocked by the lower first inorganic layer 85, as indicated by the arrow H16 in FIG. 13B. Therefore, Comparative Example 4 reduces the moisture penetration compared to that indicated by the arrow H11 in FIG. 13A.

In Comparative Example 4, moisture does not enter the first organic layer 84 unless the moisture passes through pinholes in the second inorganic layer 87, as indicated by the arrow H17 in FIG. 13B. Therefore Comparative Example 4 reduces the moisture penetration compared to that indicated by the arrow H13 in FIG. 13A.

However, if moisture passes through the pinholes in the second inorganic layer 87, the moisture is easily dispersed into the first organic layer 84 and reaches the organic EL element 83, as indicated by the arrow H18 in FIG. 13B. Consequently, Comparative Example 4 is not sufficient to suppress the damage to the organic EL element 83.

In this embodiment, since the thickness of the second organic layer 14h is small in the end face 14h2 (FIG. 10), even if the second inorganic layer 14i has pinholes, the dispersion of moisture in the second organic layer 14h is significantly restricted, as indicated by the arrow H19 in FIG. 13C. Therefore, this embodiment can further reduce the moisture penetration indicated by the arrow H19 in FIG. 13C.

In this embodiment, moisture cannot enter the first organic layer 14f unless the moisture passes through not only the second inorganic layer 14i, but also the first inorganic layer 14g, as indicated by the arrow H20 in FIG. 13C. Moreover, even if the second inorganic layer 14i has pinholes, the moisture is blocked by the first inorganic layer 14g. Thus, this embodiment can sufficiently suppress the damage to the organic EL element 4.

In this embodiment, due to the presence of the second inorganic layer 14i, moisture cannot reach the first organic layer 14f (i.e., the layer other than the uppermost second organic layer 14h) unless the moisture passes through both the first inorganic layer 14g and the second inorganic layer

14i. Therefore, even if the second inorganic layer 14i has pinholes, this embodiment can effectively reduce the permeation of moisture.

In this embodiment, there is no portion where two or more inorganic layers are stacked in direct contact with each other. Therefore, the inorganic layers do not easily peel off due to stress, which can improve the reliability of the organic EL display device 1.

This embodiment uses a wet method to form the first organic layer 14f. Thus, the first organic layer 14f can easily be formed with high precision at a low cost. Moreover, the first organic layer 14f can be made thicker, so that it is possible to more easily protect the organic EL element 4 from foreign matter that may be on the organic EL element 4, and to further reduce the stress of the first and second inorganic layers 14g, 14i that may be placed on the organic EL element 4. Consequently, this embodiment can improve the production yield of the organic EL display device 1.

Embodiment 3

Figure 14:
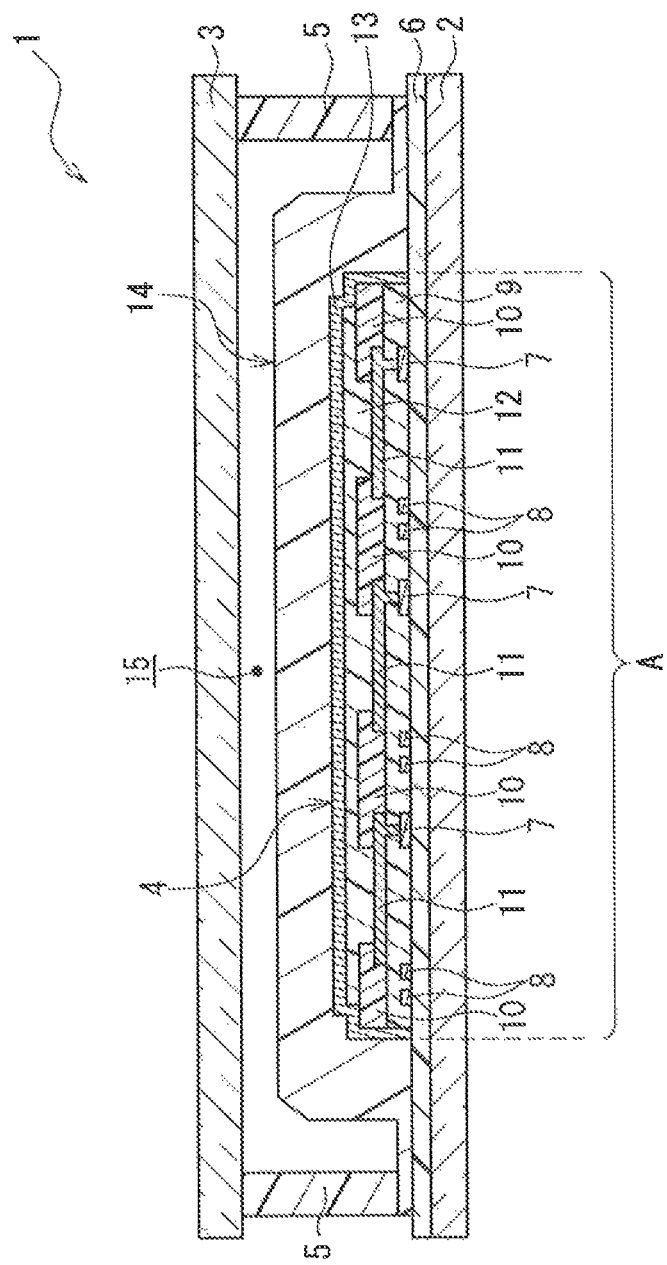
FIG. 14 is a cross-sectional view illustrating an organic EL display device of Embodiment 3 of the present invention.

FIG. 14 is a cross-sectional view illustrating an organic EL display device of Embodiment 3 of the present invention.

In FIG. 14, this embodiment mainly differs from Embodiment 1 in that a counter substrate is located on the opposite side of an organic EL element with respect to a TFT substrate, and a sealing resin (sealing material) in the form of a frame seals the organic EL element between the TFT substrate and the counter substrate. The same components as those of Embodiment 1 are denoted by the same reference numerals, and the explanation will not be repeated.

As illustrated in FIG. 14, an organic EL display device 1 of this embodiment includes a counter substrate 3 that is located opposite a TFT substrate 2, and a sealing resin (sealing material) 5 in the form of a frame that is provided between the TFT substrate 2 and the counter substrate 3. An organic EL element 4 is sealed by the TFT substrate 2, the counter substrate 3, and the sealing resin 5.

The counter substrate 3 is made of, e.g., a glass material. The sealing resin 5 is formed of a resin such as an epoxy resin in which a spacer and inorganic particles are dispersed. The spacer is used to define a cell gap between the TFT substrate 2 and the counter substrate 3. Due to the dispersion of the inorganic particles, the water vapor permeability of the sealing resin 5 can be reduced further. In FIG. 14, the sealing resin 5 is formed on the sealing film 14. Other than this configuration, the sealing film 14 may be formed inside the sealing resin 5, and the sealing resin 5 may be formed on an underlying film 6.

In the organic EL display device 1 of this embodiment, an inert gas is sealed in the space between the counter substrate 3, the sealing resin 5, and the sealing film 14.

Other than the above description, a drying agent or an oxygen absorbent may be used or a resin may be filled, instead of the inert gas. This resin may contain a drying agent or an oxygen absorbent.

With the above configuration, this embodiment can have the same effects as those of Embodiment 1. In this embodiment, the counter substrate 3 is located on the opposite side of the organic EL element 4 with respect to the TFT substrate 2, and the sealing resin (sealing material) 5 in the form of a frame seals the organic EL element 4 between the TFT substrate 2 and the counter substrate 3. Thus, this embodiment can more reliably prevent the degradation of the organic EL element 4.

The above embodiments are all illustrative and not restrictive. The technical scope of the present invention is defined by the appended claims, and all changes that come within the range of equivalency of the claims are intended to be embraced therein.

In the above description, the organic EL element is used as an electroluminescent element. However, the present invention is not limited thereto, and may use, e.g., an inorganic EL element including an inorganic compound.

In the above description, the present invention is applied to the organic EL display device. However, the present invention is not limited thereto, and may be applied to, e.g., an illuminating device such as a backlight device.

In the above description, two organic layers and two or three inorganic layers are used. However, the present invention is not particularly limited if the following conditions are satisfied: the sealing film is composed of two or more organic layers and two or more inorganic layers; each of the two or more organic layers and each of the two or more inorganic layers of the sealing film are alternately arranged; each of the two or more organic layers is formed so that the thickness gradually decreases in the end portions; and the uppermost layer of the sealing film is the inorganic layer, and the uppermost inorganic layer is provided to cover the end portions of the lower organic layers and the end portions of the lower inorganic layers. For example, the sealing film may include at least a total of 6 organic and inorganic layers.

In the above description, two or more inorganic layers are formed so that their thickness does not gradually decrease in the end portions. However, the present invention is not limited thereto, and each of the inorganic layers may be formed so that the thickness gradually decreases in the end portions.

However, as described in the above embodiments, the formation of two or more inorganic layers so that their thickness does not gradually decrease in the end portions is preferred because it is possible to easily improve the sealing performance of the sealing film with respect to the electroluminescent element. Moreover, it is also possible to easily facilitate the manufacture of the electroluminescent device as well as the formation of the inorganic layers.

In the above description, two or more organic layers are formed so that their thickness is substantially uniform in the portion located on the organic EL element (electroluminescent element). However, the present invention is not limited thereto, and each of the organic layers may be formed so that the thickness is not substantially uniform and is changed in the portion located on the electroluminescent element.

However, as described in the above embodiments, the formation of two or more organic layers so that their thickness is substantially uniform in the portion located on the electroluminescent element is preferred because it is possible to easily improve the sealing performance of the sealing film with respect to the electroluminescent element, and also to prevent a reduction in the performance of the electroluminescent device. Moreover, it is also possible to easily facilitate the manufacture of the electroluminescent device as well as the formation of the organic layers.

In the above description, the TFT substrate (substrate) and the counter substrate are made of e.g., a glass material. However, the present invention is not limited thereto, and a flexible material such as plastic may be used to form the substrate and the counter substrate. This configuration can easily provide a display device or the like having a curved display surface. In the present invention, a plurality of inorganic layers are not stacked on one another. Therefore, even if the display device or the like is bent using a flexible material, the present invention can minimize the occurrence of defects such as peeling of the inorganic layers due to stress applied by bending.

Other than the above description, Embodiments 1 to 3 may be combined as needed.

INDUSTRIAL APPLICABILITY

The present invention is useful for an electroluminescent device that reliably suppresses the permeation of moisture and has excellent reliability, and a method for manufacturing the electroluminescent device.

DESCRIPTION OF REFERENCE NUMERALS

1 Organic EL display device
2 TFT substrate (substrate)
3 Counter substrate
4 Organic EL element (electroluminescent element)
5 Sealing resin (sealing material)
14 Sealing film
14a First inorganic layer (lower inorganic layer)
14b First organic layer (lower organic layer)
14b1 Central portion
14b2 End portion
14c Second inorganic layer (lower inorganic layer)
14d Second organic layer (lower organic layer)
14d1 Central portion
14d2 End portion
14e Third inorganic layer (uppermost inorganic layer)
14f First organic layer (lower organic layer)
14f1 Central portion
14f2 End portion
14g First inorganic layer (lower inorganic layer)
14h Second organic layer (lower organic layer)
14h1 Central portion
14h2 End portion
14i Second inorganic layer (uppermost inorganic layer)
M1 (Inversely tapered) mask
D Gradual decrease region

The invention claimed is:

1. An electroluminescent device comprising:
a substrate;
an electroluminescent element provided on the substrate; and
a sealing film that seals the electroluminescent element, wherein
the sealing film includes two or more organic layers and two or more inorganic layers,
each of the two or more organic layers and each of the two or more inorganic layers of the sealing film are alternately arranged,
a thickness of each of the two or more organic layers gradually decreases in end portions,
an uppermost layer of the sealing film is one of the two or more inorganic layers, and the uppermost layer covers end portions of the two or more organic layers and end portions of the two or more inorganic layers that are located below the uppermost layer,
an underlying film is under the electroluminescent element and covers an entire surface of the substrate,
a lowermost inorganic layer of the two or more inorganic layers covers the electroluminescent element,
the lowermost inorganic layer is in contact with the underlying film outside the electroluminescent element, and
the uppermost layer is in contact with the underlying film outside the lowermost inorganic layer.

2. The electroluminescent device according to claim 1, wherein a thickness of each of the two or more inorganic layers does not gradually decrease in end portions.

3. The electroluminescent device according to claim 1, wherein a gradual decrease region in which the thickness of each of the two or more organic layers gradually decreases is provided in an outer region of the electroluminescent element on the substrate.

4. The electroluminescent device according to claim 1, wherein the thickness of each of the two or more organic layers is substantially uniform in a portion located on the electroluminescent element.

5. The electroluminescent device according to claim 1, further comprising:
a counter substrate that is located on an opposite side of the electroluminescent element with respect to the substrate; and
a sealing material defining a frame that seals the electroluminescent element between the substrate and the counter substrate.

6. A method for manufacturing the electroluminescent device according to claim 1, the method comprising:
forming a first organic layer of the two or more organic layers on the electroluminescent element or a lowermost one of the two or more inorganic layers that seals the electroluminescent element, the first organic layer having a thickness that gradually decreases in end portions;
forming an intermediate inorganic layer of the two or more inorganic layers on the first organic layer;
forming a second organic layer of the two or more organic layers on the intermediate inorganic layer, the second organic layer having a thickness that gradually decreases in end portions; and
forming an uppermost inorganic layer of the two or more inorganic layers to cover end portions of each of the two or more inorganic layers and the end portions of each of the first and second organic layers.

7. The manufacturing method according to claim 6, wherein each of the two or more inorganic layers is formed by a CVD method or an ALD method.

8. The manufacturing method according to claim 6, wherein at least the second organic layer of the first and second organic layers is formed by an evaporation method or a sputtering method.

9. The manufacturing method according to claim 6, wherein the first organic layer is formed on the electroluminescent element by a wet method.

10. The manufacturing method according to claim 6, wherein an inversely tapered mask is used to form the two or more inorganic layers other than the uppermost inorganic layer and the first organic layer and the second organic layer.

11. The electroluminescent device according to claim 1, wherein
each of the two or more organic layers includes a pixel region, an intermediate region extending outward from the pixel region, and a gradual decrease region in an outer region of the intermediate region, and
the thickness of each of the two or more organic layers is substantially uniform in the pixel region and the intermediate region.

12. The electroluminescent device according to claim 1, wherein the two or more organic layers and the two or more inorganic layers other than the uppermost layer are provided using a single mask.

13. The electroluminescent device according to claim 1, wherein
- the two or more organic layers include a first organic layer and a second organic layer,
- the two or more inorganic layers include a first inorganic layer and a second inorganic layer,
- the first organic layer, the first inorganic layer, the second organic layer, and the second inorganic layer are arranged on the electroluminescent element in this order, and
- a position of an end surface of the first organic layer is closer to the electroluminescent element than that of an end surface of the second organic layer.

\* \* \* \* \*